United States Patent

Yang et al.

Patent Number: 5,859,447
Date of Patent: Jan. 12, 1999

[54] HETEROJUNCTION BIPOLAR TRANSISTOR HAVING HETEROSTRUCTURE BALLASTING EMITTER

[76] Inventors: Edward S. Yang, 3 Hunting Trail, Armonk, N.Y. 10504; Yue-Fei Yang, 535 W. 111th St., Apt. 25, New York, N.Y. 10025

[21] Appl. No.: 853,238

[22] Filed: May 9, 1997

[51] Int. Cl.$^6$ ............ H01L 31/0328; H01L 31/0536; H01L 31/092

[52] U.S. Cl. ............ 257/197; 257/198; 257/200; 257/201

[58] Field of Search .................. 257/197, 200, 257/198, 201, 577, 540–543; 438/694, 312, 321, 331, 288

[56] References Cited

U.S. PATENT DOCUMENTS

| | | | |
|---|---|---|---|
| 5,252,841 | 10/1993 | Wen et al. | 257/577 |
| 5,389,554 | 2/1995 | Liu et al. | 437/31 |
| 5,401,357 | 3/1995 | Okuhira et al. | 438/694 |
| 5,420,052 | 5/1995 | Morris et al. | 257/197 |
| 5,445,976 | 8/1995 | Henderson et al. | 257/197 |
| 5,508,536 | 4/1996 | Twynam et al. | 257/197 |
| 5,508,538 | 4/1996 | Twynam et al. | 257/197 |
| 5,536,952 | 7/1996 | Shikata | 257/197 |
| 5,648,294 | 7/1997 | Bayraktaroglu | 438/312 |
| 5,668,388 | 9/1997 | Delage et al. | 257/198 |
| 5,672,522 | 9/1997 | Streit et al. | 438/312 |

FOREIGN PATENT DOCUMENTS 0 575 247 A1  12/1990  European Pat. Off. .............. 257/198

OTHER PUBLICATIONS

Wu et al., "An AlGaAs/GaAs Heterostructure–Emitter Bipolar Transistor", IEEE Electron Device Letters 11(6), Jun. 1990, pp. 264–266.

Gao et al., "Emitter Ballasting Resistor Design for, and Current Handling Capability of AlGaAs/GaAs Power Heterojunction Bipolar Transistor", IEEE Transactions on Electron Devices 38(2), Feb. 1991, pp. 185–195.

Liu et al., "Temperature dependences of Current Gains in GaIn/GaAs and AlGaAs/GaAs Heterojunction Bipolar Transistors", IEEE Transactions on Electron Devices 40(7), Jul. 1993, pp. 1351–1353.

Chen et al., "The study of emitter thickness effect on the heterostructure emitter bipolar transistors", J. Appl. Phys. 74(2), Jul. 15, 1993, pp. 1398–1402.

Yang et al., "Suface Recombination Current in InGaP/GaAs Heterostructure–Emitter Bipolar Transistors", IEEE Transactions on Electron Devices 41 (5), May 1994, pp. 643–647.

(List continued on next page.)

Primary Examiner—Tom Thomas
Assistant Examiner—Cuong Quang Nguyen
Attorney, Agent, or Firm—Pennie & Edmonds LLP

[57] ABSTRACT

An HBT device having heterostructure ballasting emitter is disclosed. The heterostructure ballasting emitter includes an n-type emitter setback layer on a base layer and a wide-gap ballasting emitter layer on the setback layer. The heterostructure ballasting emitter is made so that the band gap of the emitter setback layer is equal to or larger than that of the base layer and the band gap of the ballasting emitter layer is larger than that of the emitter setback layer. The heterostructure of the emitter setback layer and the ballasting emitter layer serves as the ballast. By changing the value of the valance offset between the emitter setback layer and the ballasting emitter layer, the temperature dependence of the current gain becomes adjustable. As a consequence, the present invention overcomes hurdles posed by the current gain collapse and a negative differential resistance and improves the use of the HBTs in microwave power applications.

3 Claims, 5 Drawing Sheets

OTHER PUBLICATIONS

Liu et al., "The Collapse of Current Gain in Multi–Finger Heterojunction Bipolar Transistors: Its Substrate Temperature Dependence, Instability Criteria, and Modeling", IEEE Transactions on Electron Devices 41 (10), Oct. 1994, pp. 1698–1707.

Yang et al., "Comparison of GaInP/GaAs Heterostructure–Emitter Bipolar Transistors and Heterojunction Bipolar Transistors", IEEE Transactions on Electron Devices 42(7), Jul. 1995, pp. 1210–1214.

Liu et al., "The Use of Base Ballasting to Prevent the Collapse of Current Gain in AlGaAs/GaAs Heterojunction Bipolar Transistors", IEEE Transactions on Electron Devices 43 (2), Feb. 1996, pp. 245–251.

HETEROJUNCTION BIPOLAR TRANSISTOR HAVING HETEROSTRUCTURE BALLASTING EMITTER

FIELD OF THE INVENTION

This invention relates to heterojunction bipolar transistors used for microwave and power applications. More particularly, it relates to bipolar transistors that utilize heterostructure emitters with depleted passivation ledges to achieve an enhanced performance at a high power level.

BACKGROUND OF THE INVENTION

Figure 1:
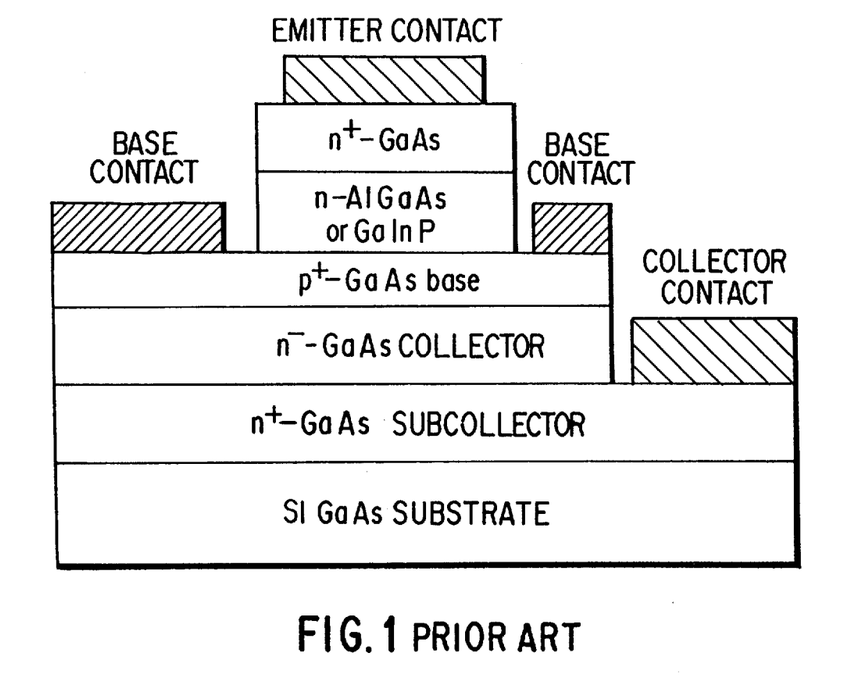
FIG. 1 is a schematic diagram of a prior art HBT.

Heterojunction bipolar transistors (HBTs) are expected to play a large role in the future microwave and millimeter-wave power applications. The structure of a conventional HBT is depicted in FIG. 1. The HBT has a semi-insulating GaAs substrate, a $n^+$-GaAs subcollector layer, a $n^-$-GaAs collector layer, a $p^+$-GaAs base layer, a n-AlGaAs or GaInP emitter layer, and a $n^+$-GaAs emitter cap layer. Because the HBTs have high speed, high current handling capability and high power efficiency, microwave power amplifiers using the AlGaAs/GaAs or GaInP/GaAs HBTs have demonstrated excellent performance.

However, there are two major drawbacks in using the HBTs as power transistors in these microwave applications, particularly when a large number of the HBTs are used. The current gain of an HBT in the prior art has a temperature dependence of $\sim\exp(\Delta E_V/kT)$, where $\Delta E_V$ is the valance band offset energy of the heterojunction, i.e., the current gain decreases with the increase of junction temperature. This behavior together with self-heating effect results in a negative differential resistance (NDR) in an I-V curve. As a consequence, when the junction temperature rises, the performance of the HBT deteriorates.

Figure 2:
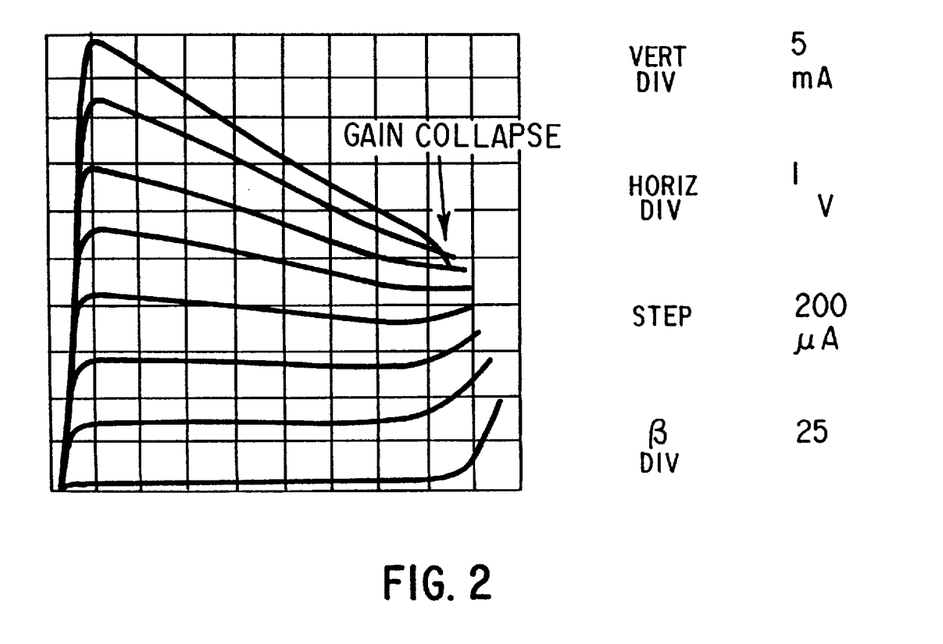
FIG. 2 is an I-V curve of a prior art two-finger GaInP/GaAs HBT device.

The second problem is related to the current gain collapse at a high operation bias. When a multi-finger HBT device is operated at a high current level to generate a large power output, the device's thermal property becomes unstable, and ultimately the current gain of the multi-finger HBT device collapses. FIG. 2 displays as an example I-V curve of a conventional two-finger GaInP/GaAs HBT device. As the operation bias is increased, the thermal effect causes the current gain to collapse.

The problems of the NDR and the current gain collapse are related to the emitter structure of the HBT. According to W. Liu et al.'s article, "Temperature dependence of current gains in GaInP/GaAs and AlGaAs/GaAs heterojunction bipolar transistors," *IEEE Trans. Electron Device*, vol. 40, No. 7 (1993), pp. 1351–1353, the gain degradation with increasing temperature for a conventional HBT is largely attributed to the structure limitations in which the value of $\Delta E_V$ is not high enough and the hole current injected from the base to the emitter is dominated by diffusion.

In the prior art, the problems were overcome by using an emitter ballast resistor. See, for example, G. B. Gao et al., "Emitter ballasting resistor design for, and current handling capability of AlGaAs/GaAs power heterojunction bipolar transistors," *IEEE Trans. Electron Device*, vol. 38, No. 2 (1991), pp. 185–197. However, the ballast resistor results in the power gain reduction and degrades the RF performance. Recently, U.S. Pat. No. 5,389,554, granted to W. Liu et al. on Feb. 14, 1995, discloses another method to increase the valence band offset by changing aluminum composition in an AlGaAs/GaAs system so as to prevent the NDR. However, changing material composition is only applicable to the AlGaAs/GaAs system because of lattice mismatch with other materials.

Alternatively, W. Liu et al.'s article, "The use of base ballasting to prevent the collapse of current gain in AlGaAs/GaAs heterojunction bipolar transistors," *IEEE Trans. Electron Device*, vol. 43, No. 2 (1996), pp. 245–251, discloses the use of base ballast to prevent the gain collapse. However, in order to maintain the RF performance, this technique requires a larger capacitance which costs the chip area thereby reducing the efficiency of integration of the HBTs.

SUMMARY OF THE INVENTION

Therefore, it is an object of the invention to reduce the current gain collapse and the NDR of a multi-finger HBT device.

It is an object of this invention to have a new emitter design to improve the thermal property of the multi-finger HBT device.

It is an object of this invention to have a new emitter design which can maintain the excellent performance of the HBT at a high power level.

These objects are achieved in accordance with the invention in a multi-finger HBT device having heterostructure ballasting emitters and using depleted passivation ledge structures for the emitters of the HBTs. Each heterostructure ballasting emitter includes a n-type setback layer and a wide-gap ballasting layer. The bandgap of the emitter setback layer is equal to or larger than that of a base layer of the HBT. The band gap of the ballasting emitter layer is larger than that of the setback layer for the HBT emitter. The heterostructure of the emitter setback layer and the ballasting emitter layer serves as the ballast. By changing the valance band offset of the emitter setback layer and the ballasting emitter layer, the temperature dependence of the current gain becomes adjustable, and positive temperature dependence of the current gain can be obtained.

The multi-finger HBT device of a first preferred embodiment of the invention comprises a plurality of GaInP/$Al_xGa_{1-x}$As/GaAs HBTs. Each HBT includes a semi-insulating GaAs substrate, a $n^+$-GaAs subcollector layer, a $n^-$-GaAs collector layer, a $p^+$-GaAs base layer, a thin n-$Al_xGa_{1-x}$-As emitter setback layer where $0 \leq x \leq 0.2$, a n-GaInP ballasting emitter layer, and a $n^+$-GaAs emitter cap layer.

In a second preferred embodiment of the invention, the multi-finger HBT device comprises a plurality of AlGaAs/GaAs HBTs each having a semi-insulating GaAs substrate, a $n^+$-GaAs subcollector layer, a $n^-$-GaAs collector layer, a $p^+$-GaAs base layer, a thin n-$Al_xGa_{1-x}$As emitter setback layer where $0 \leq x \leq 0.2$, a n-$Al_yGa_{1-y}$As emitter ballasting layer where $0.25 \leq y \leq 1$, and a $n^+$-GaAs emitter cap layer.

The multi-finger HBT device of a third preferred embodiment of the invention comprises a plurality of GaN/SiC HBTs each having a SiC substrate, a heavily doped n-SiC subcollector layer, a lightly doped n-SiC collector layer, a heavily doped p-SiC base layer, a thin n-SiC emitter setback layer, a heavily doped n-GaN emitter ballasting layer, and a $n^+$-GaN emitter cap layer.

As a consequence, the present invention overcomes hurdles posed by the current gain collapse and the NDR and improves the use of the HBTs in microwave power applications.

BRIEF DESCRIPTION OF THE DRAWINGS

These and other objects, features and elements of the present invention will be better understood from the following detailed description of preferred embodiments of the invention in which.

DETAILED DESCRIPTION OF PREFERRED EMBODIMENTS

The present invention relates to a multi-finger HBT device having heterostructure emitters and using depleted passivation ledge structures for the emitters. The heterostructure emitter of each HBT includes a n-type emitter setback layer and a wide-gap ballasting emitter layer. The band gap of the emitter setback layer is equal to or larger than that of a base layer of the HBT. The band gap of the ballasting emitter layer is larger than that of the setback layer for the emitter. The heterostructure of the emitter setback layer and the ballasting emitter layer serves as the ballast. By changing the valance band offset of the emitter setback layer and the ballasting emitter layer, the temperature dependence of the current gain becomes adjustable, and positive temperature dependence of the current gain can be obtained. The heterostructure ballasting emitter is made so that the valance band offset between the base and emitter setback layer is smaller than that between the emitter setback layer and the ballasting emitter layer. The emitter setback layer contacts with the ballasting emitter layer on one side and a base layer of the HBT transistor on the opposite side. The multi-finger HBT device of the invention has significantly enhanced the HBT device's performance at high power level.

Particularly, the heterostructure emitter of a first embodiment of the invention has a thin n-Al$_x$Ga$_{1-x}$As emitter setback layer where $0 \leq x \leq 0.2$ and a n-GaInP ballasting emitter layer. In a second embodiment of the invention, a thin n-Al$_x$Ga$_{1-x}$As emitter setback layer where $0 \leq x \leq 0.2$ and a n-Al$_y$Ga$_{1-y}$As ballasting emitter layer where $0.25 \leq y \leq 1$ are used to form the heterostructure emitter. The heterostructure emitter of a third embodiment of the invention uses a n-SiC emitter setback layer and a heavily doped n-GaN ballasting emitter layer.

Before any embodiment of the invention is described, it is helpful to understand first the physical mechanism of the thermal property for the multi-finger HBT device. The current gain of an HBT is defined as a ratio of its collector current to its base current. The temperature dependence of the current gain is a function of the collector current change rate and the base current change rate versus temperature. Unlike any prior art HBT, the multi-finger HBT device of the invention acquires an adjustable temperature coefficient of current gain. That is, the collector current can be obtained to increase faster than the base current when the temperature increases.

Figure 3A:
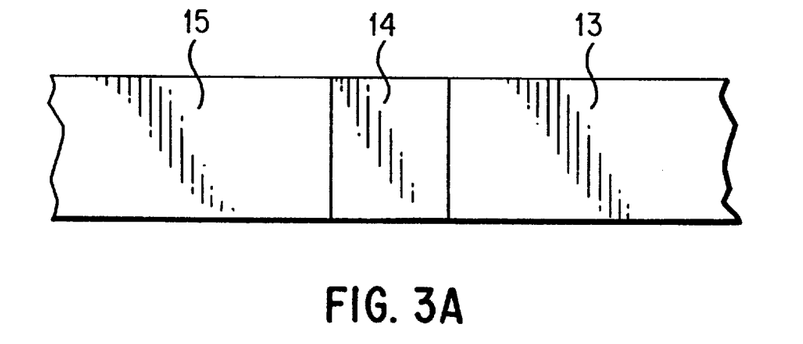
FIG. 3a is a schematic diagram of the structure of an HBT of the present invention.
Figure 3B:
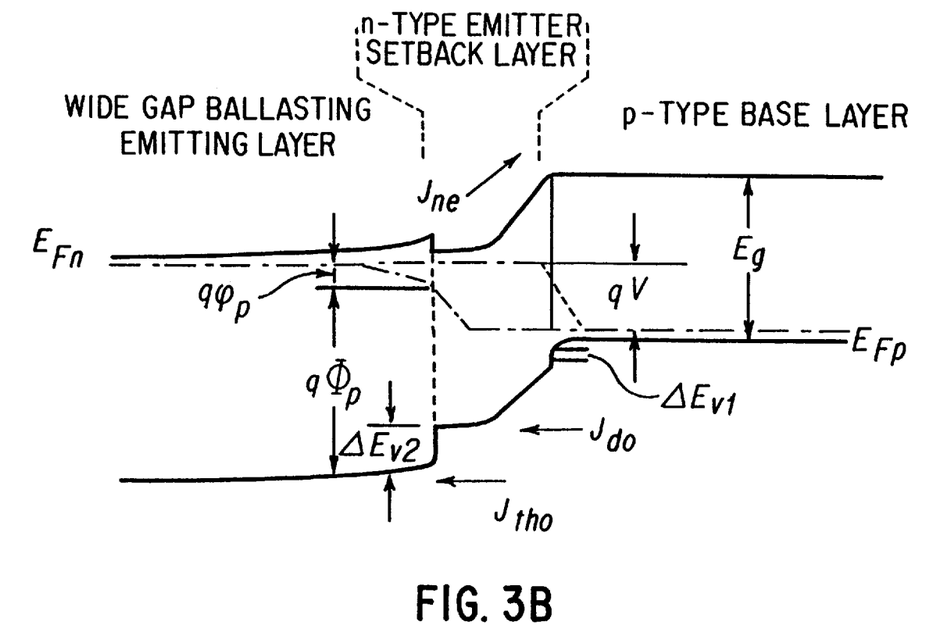
FIG. 3b is a band diagram of the HBT of the present invention.

FIGS. 3a and 3b depicts a layer structure of a heterostructure emitter and its band diagram under a forward bias. Because the heterointerface between a n-type emitter setback layer 14 and a wide-gap ballasting emitter layer 15 shifts away from the p-n junction formed by a p-type base layer 13 and the n-type emitter setback layer 14, the conduction band potential spike has little effect on the electron injection. An electron current J$_{ne}$ from the emitter to the base is a normal diffusion current expressed as:

$$J_{ne} = \frac{qD_n CT^3}{Q_B} e^{-\frac{E_g}{kT}} \left( e^{\frac{qV}{kT}} - 1 \right) \quad (1)$$

Here, q is electron charge; D$_n$ is the electron diffusion constant; Q$_B$ is the base Gummel number; C is a constant related the hole and electron masses; Eg is the band gap energy for the base layer; V is the base-emitter applied voltage; k is the Boltzmann's constant; and T is the junction temperature.

There are two hole currents in this heterostructure emitter. One is a hole diffusion current J$_{do}$ from the base to the emitter setback layer, and the other is a hole thermionic emission current J$_{tho}$ from the emitter setback layer to the wide-gap emitter ballasting region. Hence, the hole current J$_{pb}$ is expressed as Eqn. (2):

$$J_{pb} = \left\{ \frac{1}{J_{tho}} + \frac{1}{J_{do}} \right\}^{-1} \left( e^{\frac{qV}{kT}} - 1 \right) \quad (2)$$

wherein the hole diffusion current J$_{do}$ and the hole thermionic emission current J$_{tho}$ are represented respectively by $$J_{do} = \frac{qD_p CT^3}{Q_E} e^{-\frac{E_g}{kT}} e^{-\frac{\Delta E_{v1}}{kT}} \quad (3)$$

and $$J_{tho} = A^* T^2 e^{-\frac{q\Phi_p}{kT}} \quad (4)$$

Here, Q$_E$ is the Gummel number of the emitter setback layer; Dp is the hole diffusion constant in the base; $\Delta E_{V1}$ is the valance band offset between the base layer and the emitter setback layer; and A* is the hole Richardson's constant.

As shown in FIG. 3, q$\Phi_p$ is the hole barrier height between the hole quasi-Fermi level and the valence band edge at the interface and represented by $$q\Phi_p \approx E_g + \Delta E_{V2} - q\phi_p \quad (5)$$

Here, q$\phi_p$ is the energy difference between the electron and hole quasi-Fermi levels under bias at the interface of the emitter setback layer and the ballasting emitter layer; and $\Delta E_{V2}$ is the valance band offset between the emitter setback layer and the ballasting emitter layer.

It is evident from Eqn. (2) that the smaller one of these two currents dominates the transport process. In the present invention, because a depleted passivation ledge is used for the emitter layer, the space charge and surface recombination currents can be ignored. Moreover, the base transfer factor is equal to 1, i.e., the collector current is equal to the electron current of Eqn. (1). The current gain β of the present invention is given by $$\beta \simeq \frac{J_{nc}}{J_{pb}} = \frac{qD_nCT}{A^*Q_B} e^{-\frac{\Delta E_{V2}-q\phi_p}{kT}} + \frac{D_nQ_E}{D_pQ_B} e^{-\frac{\Delta E_{V1}}{kT}} \quad (6)$$

Eqn. (6) represents a temperature dependence of the current gain. The first term is the thermionic current gain, and the second term is the diffusion current gain. In the following embodiments of the invention, the base doping density and the emitter setback layer are chosen to be very high and thin respectively, and the value of $\Delta E_{V1}$ is made to be small. Because of these arrangements, the value of the second term is much smaller than that of the first term. The thermionic emission current dominates the base current and the thermal property of the current gain. Hence, the current gain of the HBT device of the invention has a temperature dependence of $\sim T\exp((\Delta E_{V2}-q\phi_p)/kT)$, which is totally different from that of the prior art HBT as shown in the Background of the Invention.

Depending on the value of $\Delta E_{V2}-q\phi_p$, the current gain of the multi-finger HBT device can have a positive or small negative temperature coefficient at a certain temperature region. When the pre-exponential T dominates in Eqn. (6), the current gain has a positive temperature coefficient. On the other hand, when the exponential term dominates, the current gain has a negative temperature coefficient. Furthermore, in contrast to the prior art HBT's thermal property of the current gain, which depends on the value of $\Delta E_{V1}$ and requires a large value of $\Delta E_{V1}$ to maintain a low negative temperature coefficient, the thermal property of the current gain for the HBT device of the invention could depend on the value of $\Delta E_{V2}-q\phi_p$ as long as $\Delta E_{V1}$ is small. When the value of $\Delta E_{V2}$ is close to $q\phi_p$, it will give the positive temperature coefficient of current gain. Even though the value of $\Delta E_{V2}$ is small such as in an AlGaAs/GaAs system, the current gain of the AlGaAs/GaAs HBT of this invention can be almost constant with temperature change.

The value of $q\phi_p$ is a function of the emitter-base bias, junction temperature, doping density and thickness of the emitter setback layer. The higher the bias, the higher value of $q\phi_p$. The higher temperature, the lower value of $q\phi_p$. The thicker the emitter setback layer, the lower value of $q\phi_p$.

Accordingly, a proper design of the emitter setback layer is important to acquire a good thermal property of the multi-finger HBT device. The inventors have found such a structure that provides the following advantages: the current gain has a positive temperature coefficient, and is independent of the temperature at certain temperature region. Moreover, unlike the prior art approaches, the device of the invention does not require an additional ballast resistor since the heterostructure serves as a ballast. Finally, the power at which the current gain collapses is much increased.

The first preferred embodiment of the invention is now described as follows. The multi-finger HBT device comprises a plurality of GaInP/Al$_x$Ga$_{1-x}$As/GaAs HBTs where $0 \leq x \leq 0.2$ each having a heterostructure emitter and using a depleted passivation ledge for the emitter. Emitters, bases, and collectors of the multi-finger HBT device are connected together correspondingly. Fabrication process for the multi-finger HBT device in the first embodiment begins with a multi-layer structure which is epitaxially grown by Metal Organic Chemical Vapor Deposition (MOCVD) or Molecular Beam Epitaxy (MBE). For convenience of reference, like elements in the following figures are given the same reference designation.

Figure 4:
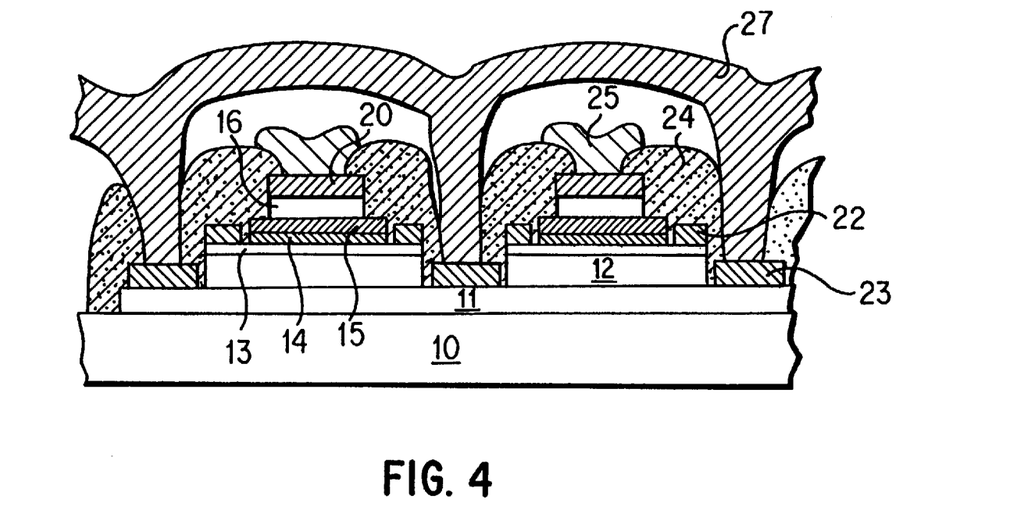
FIG. 4 is a schematic diagram of an HBT of the present invention (side view).

According to FIG. 4, each HBT comprises a semi-insulating GaAs substrate 10, a n$^+$-GaAs subcollector layer 11, a n$^-$-GaAs collector layer 12, a p$^+$-GaAs base layer 13, a thin n-Al$_x$Ga$_{1-x}$As emitter setback layer 14 with $0 \leq x \leq 0.2$, a n-GaInP ballasting emitter layer 15, and a n$^+$-GaAs emitter cap layer 16.

The thickness and doping density of the collector layer depend on the requirement of the breakdown voltage and the RF performance. A typical thickness for the collector layer is 4,000–20,000 Å. It is preferred to use a thickness of 5,000 Å for a low power application and 10,000 Å for a high power application. The doping density of the collector layer is from $1\times10^{16}$ to $1\times10^{17}$ atoms/cm$^3$, and preferred to be $1\times10^{16}$ atoms/cm$^3$ for high breakdown voltage.

The base layer has a thickness of 500–1,200 Å, preferably 1,000 Å. A doping density of the base layer is more than $1\times10^{19}$ atoms/cm$^3$, typically $6\times10^{19}$ atoms/cm$^3$.

The n-Al$_x$Ga$_{1-x}$As emitter setback layer is grown on the base layer. The thickness and doping density of the emitter setback layer determine the device's thermal property. A typical thickness used for the emitter setback layer is 100–300 Å, preferably 150 Å. The doping density is in the range of $5\times10^{16}$ to $5\times10^{17}$ atoms/cm$^3$. The n-GaInP ballasting emitter layer is grown on the emitter setback layer with a thickness of 200–1,000 Å, preferably 500 Å and a typical doping density of $1\times10^{17}$ atoms/cm$^3$. The thickness of the ballasting emitter layer is designed to be depleted by the p-n junction at zero bias. As shown in FIG. 4, the ballasting emitter layer and emitter setback layer are made wider than the emitter cap layer to form a ledge. Since the ledge of the emitter setback layer and the ballasting emitter layer is depleted by the base-emitter p-n junction, the base surface near the emitter mesa periphery is passivated by the depleted ledge so that the surface recombination current is greatly reduced.

The thickness of the emitter cap layer is in the range of 1,000–2,000 Å, and its doping density is as higher as possible, typically $4\times10^{18}$ atoms/cm$^3$. As an alternative, a n$^+$-InGaAs strained layer is grown on the n$^+$-GaAs emitter cap layer in order to reduce the emitter contact resistance.

The connection for the HBT of the invention is provided as follows. A metal layer 20 of AuGeNi/Au in thickness of 1000/1000 Å is deposited on the top of the emitter cap layer by an evaporation or sputtering technique. The metal layer is used as an emitter electrode for the HBT. Similarly, an AuZn/Au metal in the thickness of 200/1000 Å is deposited on the base layer to form a base metal contact 22. A collector metal contact 23 made of AuGeNi/Au in a thickness of 1000 Å/1000 Å is formed on the subcollector layer. Alternatively, a Ti/Pt/Au metal layer can be used for these metal contact layers.

Figure 5:
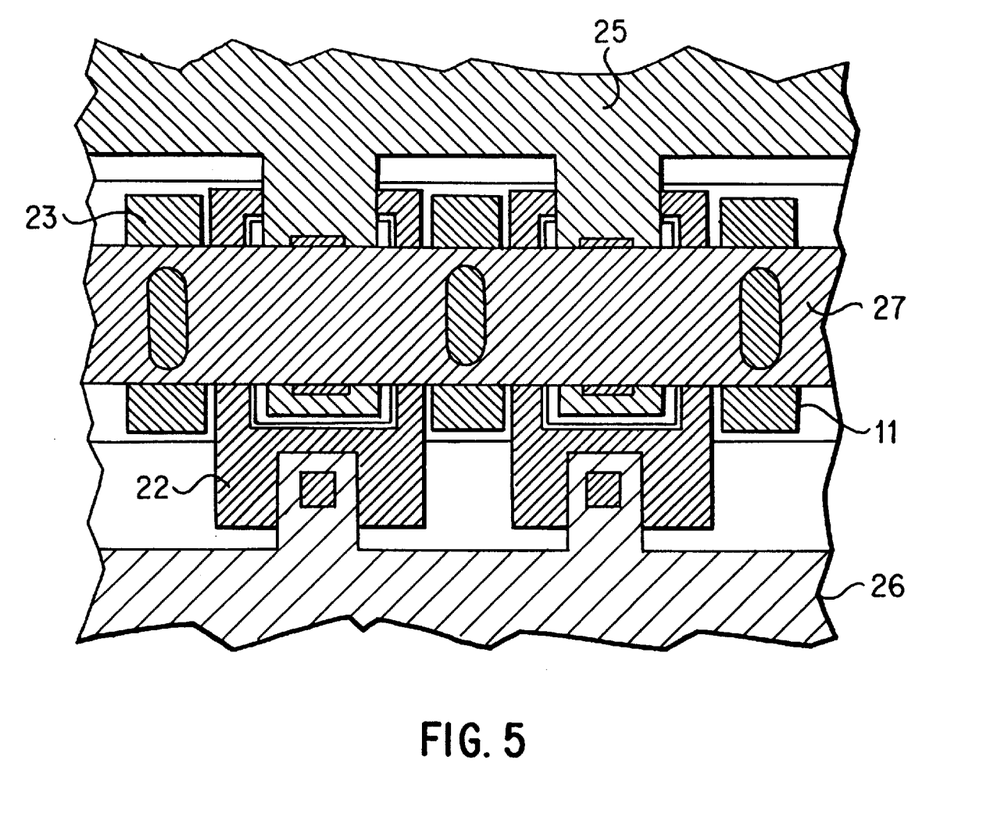
FIG. 5 is a schematic diagram of an HBT of the present invention (top view).

To make the interconnection between the HBTs, a dielectric material 24 is first deposited on the HBT structure. Then, via hole windows in the dielectric material for the emitter, base and collector contacts are made by photolithography. The dielectric material includes silicon dioxide, silicon nitride, or polyimides. As depicted in FIGS. 4 and 5 respectively, an emitter interconnect metal 25 and a base interconnect metal 26 are formed by depositing Au and using the lift-off technique to connect each individual emitter contact and each individual base contact respectively. Similarly, a second level metal 27 connecting each collector contact is formed by photolithography and electroplating. There is an air gap formed between the emitter interconnect metal 25 and the second level metal 27.

As a comparative example, a two-finger conventional HBT device is also fabricated. This HBT device has a semi-insulating GaAs substrate, a n$^+$-GaAs subcollector layer, a n$^-$-GaAs collector layer, an p$^+$-GaAs base layer, a GaInP emitter layer, and a n$^+$-GaAs emitter cap layer. The thickness and doping density of each layer of this comparative example are adopted to be the same as those used in the HBT device of the invention.

Figure 6:
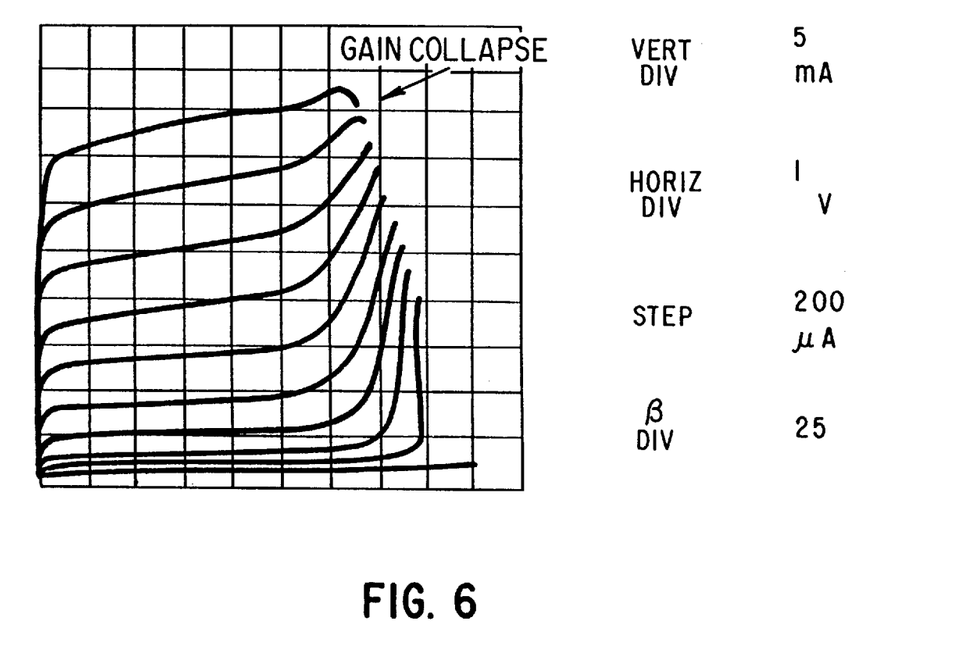
FIG. 6 is an I-V curve of a two-finger GaInP/Al$_x$Ga$_{1-x}$As/GaAs HBT device of the present invention.

FIG. 6 demonstrates an I-V curve for a two-finger GaInP/Al$_x$Ga$_{1-x}$As/GaAs HBT device of the invention when x=0.

The increase of the collector-emitter bias voltage corresponds to the increase of junction temperature caused by the device's self-heating effect. It is clearly shown from the I-V curve that a positive differential resistance is obtained because the current gain increases with the increase of junction temperature. Moreover, it can be concluded from FIGS. 2 and 6 that the two-finger HBT device of the invention collapses at 310 mW as opposed to 220 mW for the conventional two-finger HBT device. That is, the power at which the current gain collapses for the present invention is 40% higher. Note, however, that the positive differential resistance in the I-V curve is not due to Early (base width modulation) effect because the base layer is heavily doped.

In order to confirm that the current gain of the GaInP/GaAs HBT device increases with the increase of junction temperature, the current gain at zero base-collector bias is measured at different substrate temperatures. The junction temperature is almost the same as substrate temperature because of the zero bias at the base collector junction. The current gain at different temperatures are normalized with respect to the value at room temperature.

Figure 7:
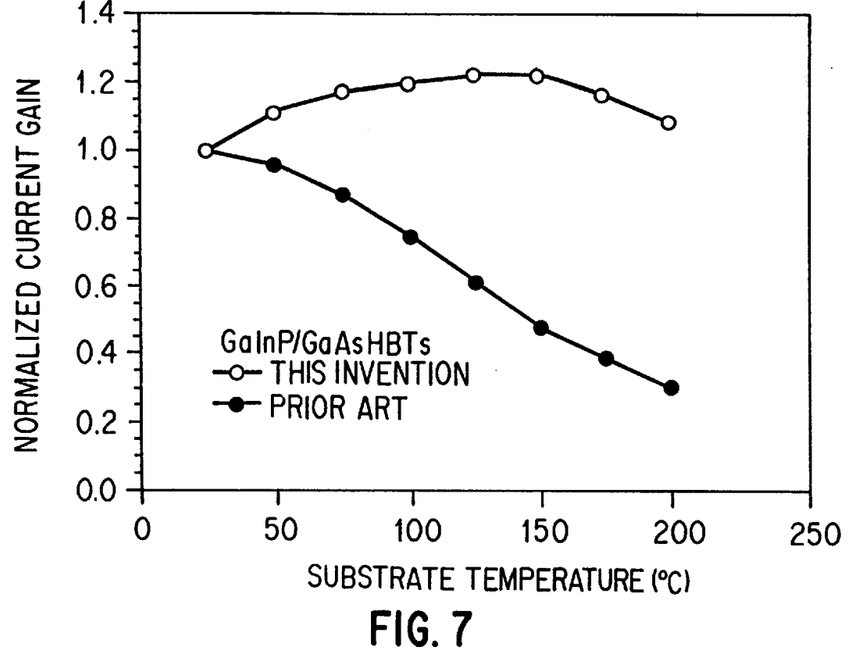
FIG. 7 displays a normalized current gain versus substrate temperature for GaInP/Al$_x$Ga$_{1-x}$As/GaAs HBT of the present invention.

FIG. 7 shows the normalized current gains versus the substrate temperatures for the GaInP/GaAs HBT devices of both the invention and the comparative example. The current gain for the HBT of the invention increases when the substrate temperature is raised from room temperature to 150° C., which reflects the results of the positive differential resistance in the I-V curve and also verifies Eqn (6). If the current gain always increases with the increase of the temperature, the increase of current may cause the increase of the junction temperature. The positive feedback of the current and junction temperature results in the device's thermal runway. However, the current gain slightly decreases after temperature is higher than 150° C. This is because the exponential term in Eqn. (6) dominates the temperature dependence. Therefore, the HBT device of the invention is prevented from thermal runaway.

In contrast, the HBT device of the comparative example, which does not have the heterostructure emitters with depleted passivation ledge structures, displays a negative differential resistance as that existed in the prior art.

In the second preferred embodiment of the invention, a multi-finger HBT device comprises a plurality of AlGaAs/GaAs HBTs each having a semi-insulating GaAs substrate, a $n^+$-GaAs subcollector layer, a $n^-$-GaAs collector layer, a $p^+$-GaAs base layer, a thin n-$Al_xGa_{1-x}$As emitter setback layer with $0 \leq x \leq 0.2$, a n-$Al_yGa_{1-y}$As ballasting emitter layer with $0.25 \leq y \leq 1$, and a $n^+$-GaAs emitter cap layer. The layer thickness and doping density are similar to those used in the first embodiment of the invention. The HBT device of this embodiment is fabricated in the same manner as described in the first embodiment of the invention.

Figure 8:
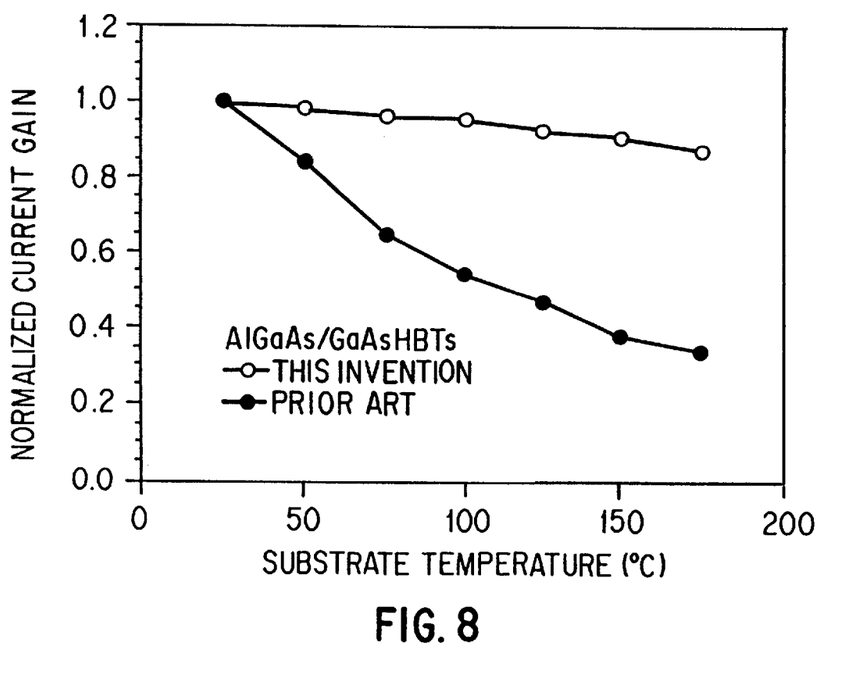
FIG. 8 displays a normalized current gain versus substrate temperature for AlGaAs/GaAs HBT of the present invention.

FIG. 8 shows the normalized current gain as a function of the substrate temperature for the AlGaAs/GaAs HBT device of the invention with an emitter setback layer of $Al_xGa_{1-x}$As where x=0. The current gain remains almost constant with the increase of temperature for the AlGaAs/GaAs HBT device. Thus, the HBT device of the invention can handle high output power without obvious performance degradation.

For comparison, experimental data from M. F. Chang's book, "Current trends in heterojunction bipolar transistors", World Scientific, 1996, P.281, are also plotted in the figure. Since the valence band offset of the AlGaAs/GaAs system is low, the current gain of the comparative AlGaAs/GaAs HBT device decreases greatly with the increase of temperature as shown in FIG. 8. This comparison further verifies that the thermal property of the multi-finger HBT device of the invention depends on the value of $\Delta E_{V2}-q\phi_p$, rather than the value of $\Delta E_{V1}$ existed in the conventional HBT device.

The multi-finger HBT device of the third preferred embodiment of the invention comprises a plurality of GaN/SiC HBTs each having a SiC substrate, a heavily doped n-SiC subcollector layer, a lightly doped n-SiC collector layer, a heavily doped p-SiC base layer, a thin n-Sic emitter setback layer, a heavily doped n-GaN ballasting emitter layer, and a $n^+$-GaN emitter cap layer. The n-SiC emitter setback layer has a preferable thickness of 100–300 Å.

The GaN/SiC HBT device of this embodiment is fabricated in the same manner as described above and used for power applications.

It is understood that various other modifications will be readily apparent to those skilled in the art without departing from the scope and spirit of the invention. Accordingly, it is not intended that the scope of the claims appended hereto be limited to the description set forth herein, but rather that the claims be construed as encompassing all the features of the patentable novelty that reside in the present invention, including all features that would be treated as equivalents thereof by those skilled in the art to which this invention pertains.

What is claimed is:

1. A multi-finger HBT device comprising:
   a plurality of heterojunction bipolar transistors, said heterojunction bipolar transistor comprising
   a semi-insulating substrate;
   a subcollector layer on said semi-insulating substrate;
   a collector layer on said subcollector layer, said collector layer being comprised of $n^-$-GaAs;
   a base layer on said collector layer, said base layer being comprised of $p^+$-GaAs;
   a heterostructure emitter having a n-type setback layer and a wide-gap ballasting emitter layer, said emitter setback layer being on said base layer, and said ballasting emitter layer being on said emitter setback layer,
   wherein said emitter setback layer is comprised of n-$Al_xGa_{1-x}$As with $0 \leq x \leq 0.2$, and said ballasting emitter layer is comprised of n-GaInP; and
   an emitter cap layer on said ballasting emitter layer,
   wherein said heterostructure emitter has a larger width than said emitter cap layer such that a depleted passivation ledge is formed; and
   means for interconnecting said collector layer, said base layer, and said emitter of each heterojunction bipolar transistor respectively.

2. A multi-finger HBT device comprising:
   a plurality of heterojunction bipolar transistors, said heterojunction bipolar transistor comprising
   a semi-insulating substrate;
   a subcollector layer on said semi-insulating substrate;
   a collector layer on said subcollector layer, said collector layer being comprised of $n^-$-GaAs;
   a base layer on said collector layer, said base layer being comprised of $p^+$-GaAs;
   a heterostructure emitter having a n-type setback layer and a wide-gap ballasting emitter layer, said emitter setback layer being on said base layer, and said ballasting emitter layer being on said emitter setback layer,
   wherein said emitter setback layer is comprised of n-$Al_xGa_{1-x}$As with $0 \leq x \leq 0.2$, and said ballasting emitter layer is comprised of n-$Al_yGa_{1-y}$As with $0.25 \leq y \leq 1$; and an emitter cap layer on said ballasting emitter layer,
    wherein said heterostructure emitter has a larger width than said emitter cap layer such that a depleted passivation ledge is formed; and
means for interconnecting said collector layer, said base layer, and said emitter of each heterojunction bipolar transistor respectively.

3. A multi-finger HBT device comprising:
a plurality of heterojunction bipolar transistors, said heterojunction bipolar transistor comprising
    a semi-insulating substrate;
    a subcollector layer on said semi-insulating substrate;
    a collector layer on said subcollector layer, said collector layer being comprised of lightly doped n-SiC;
    a base layer on said collector layer, said base layer being comprised of heavily doped p-SiC;
    a heterostructure emitter having a n-type setback layer and a wide-gap ballasting emitter layer, said emitter setback layer being on said base layer, and said ballasting emitter layer being on said emitter setback layer,
    wherein said emitter setback layer is comprised of n-SiC, and said ballasting emitter layer is comprised of heavily doped n-GaN; and
    an emitter cap layer on said ballasting emitter layer,
    wherein said heterostructure emitter has a larger width than said emitter cap layer such that a depleted passivation ledge is formed; and
means for interconnecting said collector layer, said base layer, and said emitter of each heterojunction bipolar transistor respectively.

* * * * *